United States Patent [19]

Cubbison, Jr.

[11] 3,725,799

[45] Apr. 3, 1973

[54] POLE FREQUENCY STABILIZED ACTIVE RC FILTER

[75] Inventor: Richard James Cubbison, Jr., Burlington, N.C.

[73] Assignee: Bell Telephone Laboratories, Incorporated, Murray Hill, Berkeley Heights, N.J.

[22] Filed: Jan. 12, 1972

[21] Appl. No.: 217,169

[52] U.S. Cl. ....................330/21, 330/107, 333/80 T

[51] Int. Cl. ............................................H01p 1/32

[58] Field of Search..333/80 R, 80 T; 330/21, 124 R, 330/9, 107

*Primary Examiner*—John Kominski

*Attorney*—R. J. Guenther et al.

[57] ABSTRACT

In an active RC filter exhibiting a predetermined signal transfer characteristic, a reference signal is applied to the input of the filter and examined for phase shift at the low-pass signal output of the filter. A signal proportional to the variation in phase of the reference signal is used to alter a voltage controlled resistor, which in turn varies the pole frequency of the filter. The reference signal is cancelled from the signal appearing at the bandpass output of the filter to remove it from the final desired output of the filter.

12 Claims, 6 Drawing Figures

POLE FREQUENCY STABILIZED ACTIVE RC FILTER

BACKGROUND OF THE INVENTION

This invention pertains to transmission networks and, more particularly, to active resistance-capacitance (RC) transmission networks.

Networks devoid of inductors, i.e., inductorless networks, have become increasingly important with the development of integrated circuit technology. Since inductors are not conveniently realized in integrated circuit configurations, the advantages of integrated circuit technology may generally only be reaped from those circuits which do not include inductors. It is generally well known that a wide variety of network transfer responses, obtained from passive circuits utilizing inductors, may also be obtained from RC active networks which use only resistors, capacitors, and an active element, i.e., an amplifier.

A particular RC network topology of great interest to those skilled in the art is a filter network configuration exhibiting a general biquadratic signal transfer response. See, for example, "Active Filters: New Tools for Separating Frequencies" by L. C. Thomas, *Bell Laboratories Record*, Vol. 49, No. 4, April 1971, pp. 121–125. Recent improvements in such networks, hereinafter referred to as biquads, have resulted in compensation techniques and circuit configurations which have increased the bandwidth of such filters and provided a higher quality factor, i.e., Q, for transmission poles. These improvements have, however, exposed pole frequency sensitivity problems which, for high precision applications, cannot be satisfactorily ameliorated by such conventional techniques as matching temperature coefficients.

It is therefore an object of this invention to realize an active RC network which is highly insensitive to pole frequency variations.

It is another object of this invention to monitor and correct variations of pole frequency in an active RC network.

SUMMARY OF THE INVENTION

These and other objects of this invention are accomplished, in accordance with the principles of this invention, by applying a first reference signal to the input terminal of an active filter network. The signal appearing at the low-pass output terminal of the filter network is multiplied with a second reference signal to develop an error signal. This error signal is then filtered and applied to a voltage controlled resistor to vary the pole frequency of the filter transfer response.

Further features and objects of this invention, its nature and various advantages, will be more apparent upon consideration of the attached drawing and the following detailed description.

DETAILED DESCRIPTION

Figure 1:
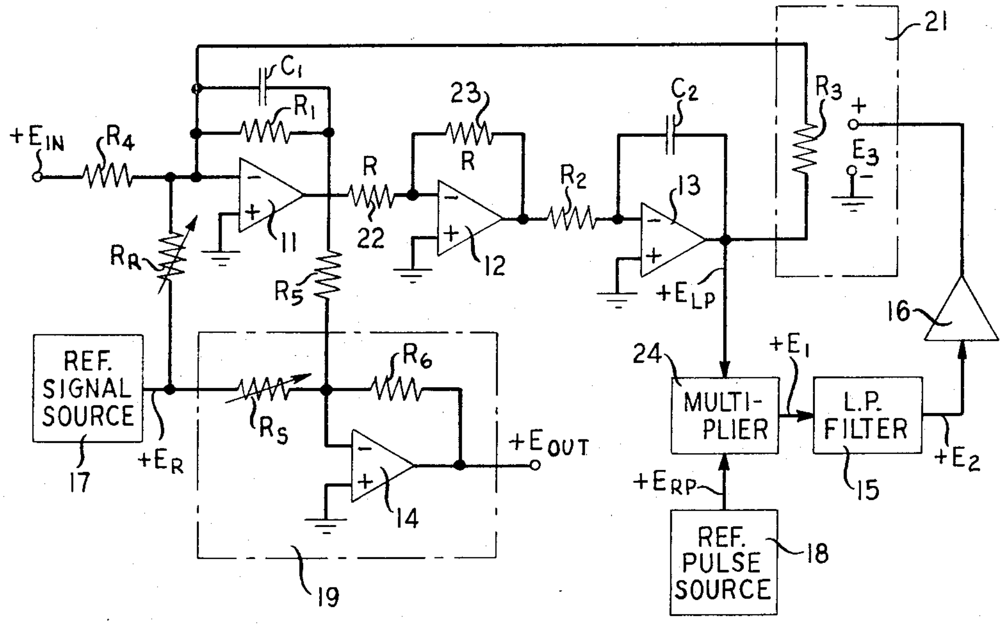
FIG. 1 depicts an active RC filter circuit modified in accordance with the principles of this invention so as to lock the pole frequency of the filter circuit to the frequency of an applied reference signal.

An RC active filter circuit, modified in accordance with the principles of this invention, is illustrated in FIG. 1. A discussion of the operation of the basic active filter circuit, oftentimes referred to as a biquad, may be found in the L. C. Thomas article, previously cited. In the prior art filter circuit under consideration, an input signal, $E_{IN}$, is normally applied via resistor $R_4$ to the inverting input terminal of operational amplifier 11, which is shunted by resistor $R_1$ and capacitor $C_1$. The output of amplifier 11 is applied via resistor 22, having a nominal value R, to a second operational amplifier 12 which is shunted by resistor 23, having a nominal value R. The output of amplifier 12 is supplied, via resistor $R_2$, to operational amplifier 13, shunted by capacitor $C_2$. The output of amplifier 13 is applied via resistor $R_3$, conventionally of fixed value, to the input of amplifier 11. Available at the output of amplifier 11, via resistor $R_5$, is the bandpass signal output of the filter circuit. Similarly, available at the output of amplifier 13, is the low-pass signal output of the filter circuit.

Figure 2A:
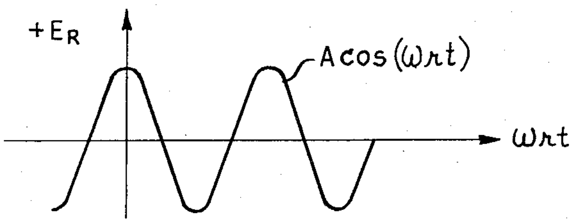
FIG. 2A depicts a first exemplary reference signal applied to the circuit of FIG. 1.

In accordance with the principles of this invention, pole frequency sensitivity problems exhibited by the filter circuit are eliminated by locking the filter pole frequency to the frequency of an applied reference signal. In general terms, the phase shift introduced in the applied reference signal by the filter circuit is sensed, and the difference between this phase shift, and that resulting if the circuit pole frequency were tuned to the reference signal frequency, is forced to zero by a feedback circuit employing a voltage controlled resistor $R_3$. This procedure locks the pole frequency of the active filter circuit to the frequency of the reference signal, eliminating changes in the pole frequency and, of course, thereby obviating pole frequency sensitivity problems. As depicted in FIG. 1, a first reference signal, $E_R$, for example a cosinusoidal wave as illustrated in FIG. 2A, is applied by source 17 via variable resistor $R_8$ to amplifier 14 which is also supplied with the bandpass output of amplifier 11 via resistor $R_5$. Resistor $R_6$ shunts amplifier 14, and the output, $E_{OUT}$, of amplifier 14 corresponds to the desired bandpass filtered input signal. In addition, the low-pass output, $E_{LP}$, of amplifier 13 is multiplied with a second reference signal, $E_{RP}$, illustrated in FIG. 2B, in multiplier 24. The second reference signal may be supplied by source 18 or derived from the signal of source 17 as discussed hereinafter. The multiplied output signal, $E_1$, is supplied to low-pass filter 15 and the output $E_2$ thereof to amplifier 16, having a gain $-\beta$. The output signal, $E_3$, of amplifier 16 is used to control voltage controlled resistor $R_3$, symbolized by broken line box 21. Thus, if there is a variation in filter pole frequency from the frequency of the first reference signal, an error signal is developed, i.e., voltage $E_3$, which alters the value of resistor $R_3$ and in turn varies the pole frequency of the filter.

For analytical purposes, it will be assumed that there is no input information signal, i.e., $E_{IN}$, supplied to resistor $R_4$. This assumption simplifies the algebra but retains the essential characteristics of the operation of the circuit of FIG. 1. The bandpass signal output, $E_{OUT}$, responsive to reference signal $E_R$ applied by resistor $R_R$ to amplifier 11, if given by $$E_{OUT(s)}/E_{R(s)} = \omega_3 S/(S^2+B_pS+\omega_p^2) - R_6/R_s \quad (1)$$

where:

$$\omega_3 = (R_6/R_5)(1/R_RC_1), \quad (2)$$

$$\omega_p^2 = 1/R_3C_1\,R_2C_2 = (\text{pole frequency})^2, \quad (3)$$

and $$B_p = 1/R_1C_1 = 3\text{ dB bandwidth}. \quad (4)$$

Reference signal $E_R$ is also supplied to amplifier 14 by variable resistor $R_s$. The apparatus enclosed by broken line box 19 serves to cancel the reference signal from the bandpass signal output of the filter when the pole frequency of the filter corresponds to the frequency of the reference signal, $E_R$. Accordingly, resistors $R_s$ and $R_6$ and amplifier 14 may be designated as a reference signal cancelling network. Thus, the second term of Eq. (1) is due to reference signal cancelling network 19. When the reference signal frequency and the pole frequency are the same, the complex variable $S$ is equal to $j\omega_p$ and thus $$E_{OUT}(j\omega_p)/E_R(j\omega_p) = (R_1R_6/R_rR_5) - R_6/R_s. \quad (5)$$

If the right-hand side of Eq. (5) is made equal to zero, then no signal output due to the reference signal will be present at the output terminal of amplifier 14. To accomplish this, the variable resistor $R_s$ is adjusted to $$R_s = R_RR_5/R_1. \quad (6)$$

The relationship between the low-pass signal output of amplifier 13 and the reference signal may be expressed as $$E_{LP}/E_R = -(\omega_1^2)/(S^2+B_pS+\omega_p^2) \quad (7)$$

where:

$$\omega_1^2 = 1/R_RC_1\,R_2C_2. \quad (8)$$

In the case of a single tone reference signal, as illustrated in FIG. 2A, defined by $$E_R = A_r\cos\omega_rt, \quad (9)$$

then, $$E_{LP} = |E_{LP}|\cos(\omega_rt+\phi), \quad (10)$$

where:

$$|E_{LP}| = \frac{A_r\omega_1^2}{\sqrt{\{\omega_p^2-\omega_r^2\}^2+\omega_r^2B_p^2}} \quad (11)$$

and $$\phi = \tan^{-1}\left[\frac{\frac{\omega_rB_p}{Q_p}}{-\{\omega_p^2-\omega_r^2\}}\right] \quad (12)$$

Figure 2B:
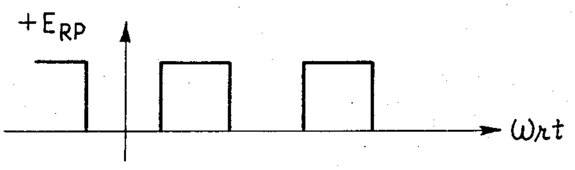
FIG. 2B depicts a second exemplary reference signal applied to the filter circuit of FIG. 1.

The low-pass output signal of amplifier 13 is multiplied in multiplier 24 by a second reference signal which is related to the first reference signal, as indicated in FIG. 2B, and defined as $$E_{RP} = \tfrac{1}{2}[1-SGN(E_r)], \quad (13)$$

where the $SGN$ function is the well-known "SIGN" function. Expanding Eq. (13) into a Fourier Series gives $$E_{RP} = \frac{1}{2}+\frac{2}{\pi}\sum_{n=1}^{\infty}\frac{(-1)^n}{2n-1}\cos[(2n-1)\omega_rt] \quad (14)$$

It follows therefore that the output of multiplier 24 is $$E_1 = E_{LP}E_{RP} = |E_{LP}|\left[\frac{1}{2}\cos(\omega_rt+\phi) + \frac{2}{\pi}\sum_{n=1}^{\infty}\frac{(-1)^n}{2n-1}\cos(\omega_rt+\phi)\cos[(2n-1)\omega_rt]\right] \quad (15)$$

Carrying out the indicated multiplications yields $$E_1 = |E_{LP}|\left[\frac{1}{2}\cos(\omega_rt+\phi) + \frac{1}{\pi}\sum_{n=1}^{\infty}\frac{(-1)^n}{2n-1}[\cos(2\omega_rt-2n\omega_rt+\phi)+\cos(2n\omega_rt+\phi)]\right] \quad (16)$$

Low-pass filter 15, which is responsive to the output of multiplier 24, may be assumed to pass only the d.c. component of signal $E_1$. Therefore, the output of filter 15 is $$E_2 = -|E_{LP}|\;1/\pi\cos\phi. \quad (17)$$

Fundamental trigonometry and the use of Eq. (12) yields $$\cos\phi = \frac{-\{\omega_p^2-\omega_r^2\}}{\sqrt{\{\omega_p^2-\omega_r^2\}^2+\omega_r^2B_p^2}} \quad (18)$$

With this result and Eqs. (11) and (17), the expression for $E_2$ becomes $$E_2 = 1/\pi\cdot(A_r\omega_1^2\{\omega_p^2-\omega_r^2\})/(\{\omega_p^2-\omega_r^2\}^2+\omega_r^2B_p^2). \quad (19)$$

Figure 3:
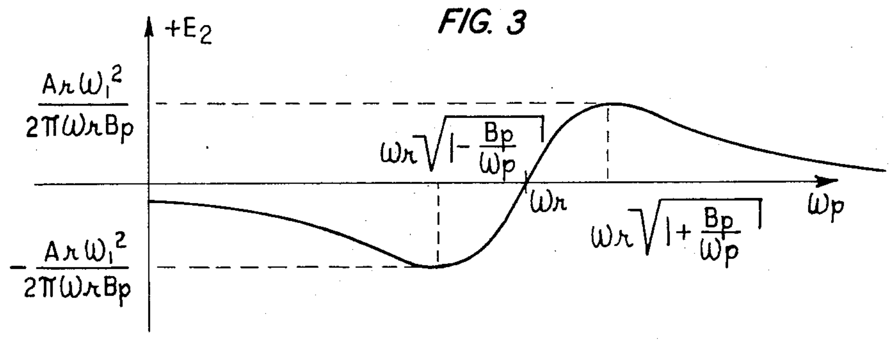
FIG. 3 illustrates the error signal developed by the apparatus of this invention due to variations between filter pole frequency and the first reference signal frequency.

The output of low-pass filter 15, i.e., $E_2$, is illustrated in FIG. 3. This portrayal indicates that when the pole frequency of the filter circuit, $\omega_p$, is in exact agreement with the first reference signal frequency $\omega_r$, then the signal $E_2$ is equal to zero. If, however, the pole frequency is larger or smaller than the reference signal frequency, the signal $E_2$ becomes positive or negative, respectively. This causes the remainder of the locking network circuitry to bring $\omega_p$, the pole frequency, closer to $\omega_r$, the reference frequency. A study of FIG. 3 and Eq. (19) will indicate that the amplitude of signal $E_2$ is very small in the vicinity of the reference signal frequency, i.e., in cases of a high degree of lock, the magnitude of control signal $E_2$ is relatively small. Thus, amplifier 16, having a gain of $-\beta$, is used to magnify the output signal of low-pass filter 15. Amplifier 16 serves the dual function of amplifying signal $E_2$ and inverting its phase to provide negative feedback around the loop. It may be shown that as the gain of amplifier 16 increases, the amplitude of signal $E_2$ decreases, thereby providing improved locking performance. The output of amplifier 16 may be expressed as $$E_3 = -\beta E_2 = -\beta A_r/\pi \cdot (\omega_1^2\{\omega_p^2 - \omega_r^2\} )/(\{\omega_p^2 - \omega_r^2\}^2 + \omega_r^2 B_p^2) . \quad (20)$$

Signal $E_3$, controls voltage controlled resistor $R_3$ in accordance with the characteristic $$R_3 = R_0 (1 - \gamma E_3), \quad (21)$$

where $R_0$ is that value of resistance which would be assumed by resistor $R_3$ in the absence of a control voltage $E_3$. The parameter $\gamma$ in Eq. (21) is the gain of the voltage controlled resistor and has the dimension of inverse volts. Returning to Eq. (3), it can be seen that resistor $R_3$ determines the value of the pole frequency of the filter network which was shown in Eq. (20) to influence the value of voltages $E_2$ and $E_3$. Furthermore, Eq. (21) relates the value of resistor $R_3$ to voltage $E_3$. Thus, the loop analysis is brought full circle, i.e., resistor $R_3$ controls the pole frequency $\omega_p$ which in turn controls signal $E_2$ which controls signal $E_3$ which in turn controls resistor $R_3$.

Figure 4:
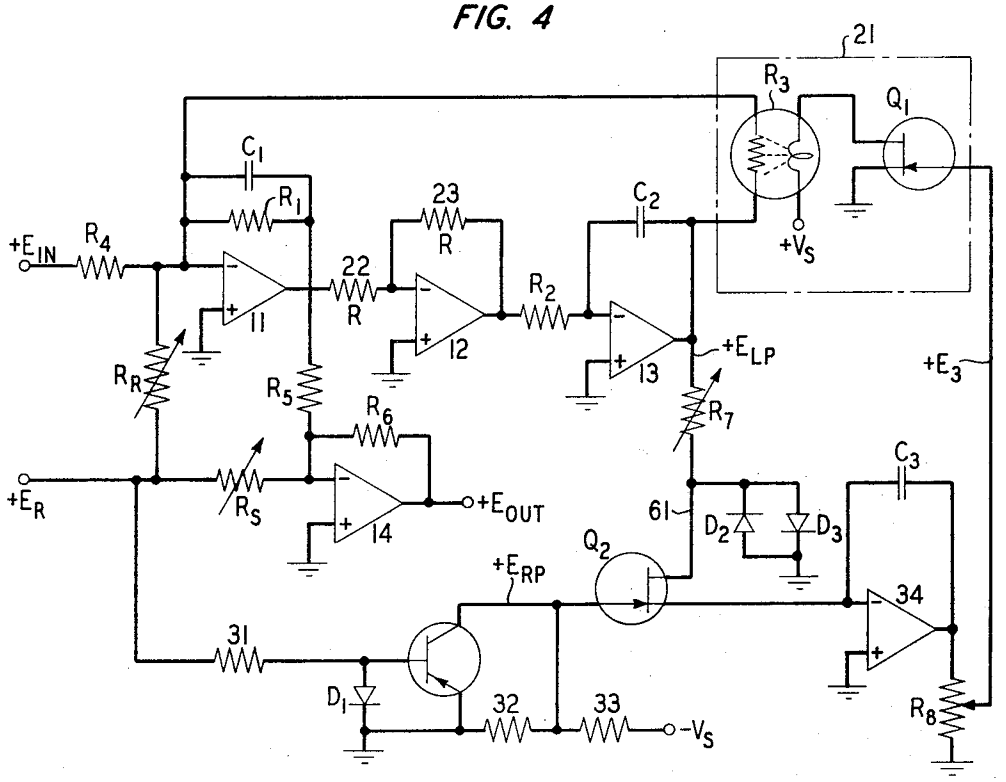
FIG. 4 is a schematic circuit diagram of the apparatus of this invention.

FIG. 4 illustrates a particular embodiment of the invention depicted in FIG. 1. Like components have been identically identified. In this specific embodiment, reference signal $E_{RP}$, applied to multiplier 24 of FIG. 1, is derived directly from the first reference signal $E_R$ to develop the desired phase relationship as indicated in FIGS. 2A and 2B. Transistor $Q_3$ and diode $D_1$, responsive to applied reference signal $E_R$, develop a series of signal pulses, $E_{RP}$, at the collector of transistor $Q_3$ during the positive half cycles of reference signal $E_R$, i.e., when transistor $Q_3$ is not conducting. During negative half cycles, however, $Q_3$ does conduct and its output collector voltage is approximately equal to ground potential. The pulse stream appearing at the collector of transistor $Q_3$ is then applied to switching transistor $Q_2$, for example, a JFET. It will be noted that the low-pass output $E_{LP}$ of the filter is applied via variable resistor $R_7$ to transistor $Q_2$. Accordingly, since transistor $Q_2$ responds to the applied pulse signals by switching on and off, it effectively multiplies the low-pass signal output with the pulse train of FIG. 2B. Diodes $D_2$ and $D_3$ serve to limit the excursions of the signals appearing at terminal 61 of transistor $Q_2$. The output signal of transistor $Q_2$ is applied to combined integrator-amplifier 34. Amplifier 34 and shunt capacitor $C_3$ serve the dual function of providing d.c. gain while performing the function of low-pass filter 15 of FIG. 1. Potentiometer $R_8$ modifies the signal output of amplifier 34 and, combined with the open loop gain of amplifier 34, realizes the function of amplifier 16 of FIG. 1. The resultant signal is applied to transistor $Q_1$, for example, a JFET, which in turn drives light coupled photosensitive resistor $R_3$, of any well-known type.

Figure 5:
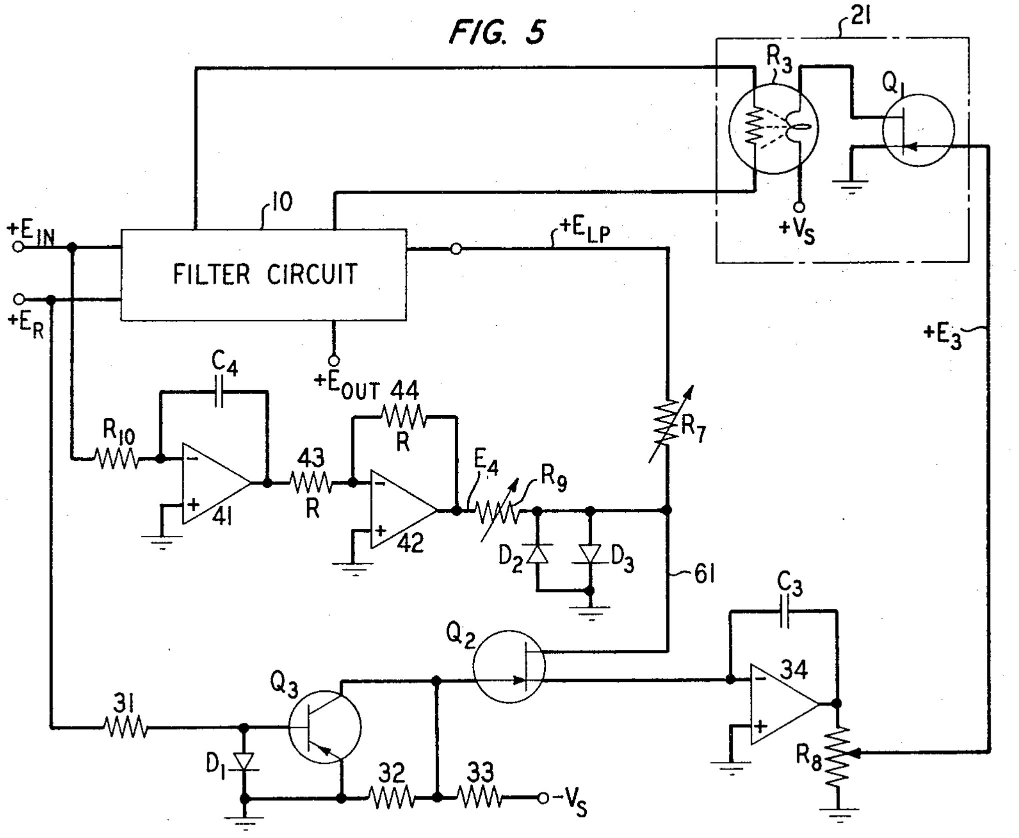
FIG. 5 depicts a modification of the circuitry of FIG. 4 to eliminate intermodulation distortion.

Having considered the operation of the circuit of this invention in response only to the reference signal frequency, by the principle of superposition, the operation will be the same when an applied information signal is also supplied to the input terminal designated $E_{IN}$. However, a form of distortion which degrades the performance of the filter may occur if frequency components of $E_{IN}$ are near reference signal frequency $\omega_r$. If these components are not removed before entering the locking loop, they may generate beat tones which modulate the pole frequency of the filter circuit. This, in turn, will cause amplitude and phase distortion of $E_{IN}$ as it proceeds through the filter circuit. It may be shown that the closer the frequency components of $E_{IN}$ are to $\omega_r$, the more serious the distortion. However, in accordance with this invention, these components may be removed from the low-pass output signal $E_{LP}$ before they enter the locking loop. This is accomplished in the manner depicted in FIG. 5. In FIG. 5, components identical to those of FIG. 1 and FIG. 4 are similarly identified, and the basic filter circuit identified as filter 10. It will be noted that in addition to the circuitry of FIG. 4, the signal $E_{IN}$ is also supplied to a resistor $R_{10}$ which in turn applies the signal to an integrator which comprises amplifier 41 and capacitor $C_4$. The output of amplifier 41 is in turn applied via resistor 43 to amplifier 42 shunted by resistor 44. Variable resistor $R_9$ applies the signal output of amplifier 42 to terminal 61 of transistor $Q_2$ where it is combined with the low-pass output $E_{LP}$ of filter 10 which is applied via resistor $R_7$. Amplifier 42 and its associated resistors serve as an inverter circuit and the output signal $E_4$ of amplifier 42 may be shown to be $$E_4 = (\omega_4/S)\, E_{IN}, \quad (22)$$

where $$\omega_4 = 1/R_{10}C_4 . \quad (23)$$

The value of the low-pass signal output $E_{LP}$ due to the input signal $E_{IN}$ is of the same form as the signal $E_4$ when the frequency of the input signal, $\omega_{IN}$, is near the locked pole frequency, $\omega_r$, of the filter. This is demonstrated by $$E_{LP} = -E_{IN}\frac{\omega_3^2}{S^2 + B_pS + \omega_r^2} \xrightarrow{S = j(\omega_{IN} \to \omega_r)} -E_{IN}\frac{\omega_3^2}{B_pS} \quad (24)$$

where $$\omega_3^2 = 1/R_4C_1\, R_2C_2 . \quad (25)$$

The combined current emanating from resistors $R_7$ and $R_9$ is therefore $$(E_4/R_9) + (E_{LP}/R_7) = E_{TN}/S\, [(\omega_4/R_9) - (\omega_3^2/R_7B_p)], \quad (26)$$

which becomes zero for the value of $R_9$ equal to $$R_9 = R_7\omega_4B_p/\omega_3^2 . \quad (27)$$

The resulting cancellation of the critical frequency components of the low-pass signal $E_{LP}$ due to the input signal $E_{IN}$ substantially reduces any intermodulation distortion and consequently improves the performance of the filter circuit. It should be noted, however, that because of the differences in the amplitudes of the various signals, the signal components of $E_{LP}$ due to the application of the reference signal $E_R$ are not affected. Thus, the effectiveness of the feedback loop is not altered by the additional circuitry of FIG. 5.

What is claimed is:

1. In an active RC filter circuit, having a low-pass signal output terminal, a bandpass signal output terminal, and a signal transfer pole frequency determining voltage controlled resistor, the improvement comprising: means for applying a first predetermined reference signal to the filter circuit input terminal;

means for multiplying the signal appearing at the low-pass output terminal of the filter circuit with a second predetermined reference signal to develop an error signal; and means responsive to said error signal for altering the resistance of the voltage controlled resistor to change the pole frequency of said filter.

2. The active RC filter circuit of claim 1 wherein said means for multiplying the signal appearing at the low-pass output terminal of said filter circuit with a second predetermined reference signal to develop an error signal further comprises:

first transistor circuit means responsive to said first reference signal for developing a signal pulse during each alternate half-cycle of said first reference signal; and second transistor circuit means for selectively multiplying the signal appearing at the low-pass output terminal of said filter circuit with said pulses developed by said first transistor circuit.

3. The active RC filter circuit of claim 1 further comprising means for removing from said signal appearing at the low-pass output terminal of said filter circuit signal frequency components, substantially near the signal frequency of said first reference signal, resulting from an input signal applied to the input terminal of said filter.

4. In an active RC filter circuit, exhibiting a predetermined signal transfer response in response to an applied input signal, having a low-pass signal output terminal, a bandpass signal output terminal, and a signal transfer pole frequency determining voltage controlled resistor connecting said low-pass output terminal and the input terminal of said filter circuit, the improvement comprising:

means for applying a first predetermined reference signal to said filter circuit input terminal;

means for multiplying the signal appearing at the low-pass output terminal of said filter circuit with a second predetermined reference signal to develop an error signal;

means responsive to said error signal for altering the resistance of said voltage controlled resistor to change the pole frequency of said filter transfer response; and means for cancelling said first reference signal from the signal appearing at said bandpass output terminal to develop a filtered version of said applied input signal.

5. The active RC filter circuit of claim 4 wherein said means for multiplying the signal appearing at the low-pass output terminal of said filter circuit with a second predetermined reference signal to develop an error signal further comprises:

first transistor circuit means responsive to said first reference signal for developing a signal pulse during each alternate half-cycle of said first reference signal; and second transistor circuit means for selectively multiplying the signal appearing at the low-pass output terminal of said filter circuit with said pulses developed by said first transistor circuit.

6. The active RC filter circuit of claim 4 further comprising means for removing from said signal appearing at the low-pass output terminal of said filter circuit signal frequency components, substantially near the signal frequency of said first reference signal, due to said applied input signal.

7. In an active RC filter circuit, having a first filtered signal output terminal, a second filtered signal output terminal, and a signal transfer pole frequency determining voltage controlled resistor, the improvement comprising:

means for applying a first predetermined reference signal to the filter circuit input terminal;

means for multiplying the signal appearing at said first filtered signal output terminal with a second predetermined reference signal to develop an error signal;

means responsive to said error signal for altering the resistance of said voltage controlled resistor to change the pole frequency of the filter transfer response; and means for cancelling said first reference signal from the signal appearing at said second filtered signal output terminal.

8. The active RC filter circuit of claim 7 wherein said means for multiplying further comprises:

first transistor circuit means responsive to said first reference signal for developing a signal pulse during predetermined intervals of said first reference signal; and second transistor circuit means for selectively multiplying the signal appearing at said first filtered signal output terminal with said pulses developed by said first transistor circuit.

9. The active RC filter circuit of claim 7 further comprising means for removing from said signal appearing at said first filtered signal output terminal of said filter circuit signal frequency components substantially near the signal frequency of said first reference signal.

10. In an active RC filter circuit, exhibiting a predetermined signal transfer response in response to an applied input signal, having a low-pass signal output terminal, a bandpass signal output terminal, and a signal transfer pole frequency determining voltage controlled resistor connecting said low-pass output terminal and the input terminal of said filter circuit, the improvement comprising:

means for applying a first predetermined reference signal to said filter circuit input terminal;

means for multiplying the signal appearing at the low-pass output terminal of said filter circuit with a second reference signal, having a predetermined phase relationship to said first reference signal, to develop an error signal;

means for filtering said error signal;

means responsive to said filtered error signal for altering the resistance of said voltage controlled resistor to change the pole frequency of said filter transfer response; and means for selectively combining said first reference signal and the signal appearing at said bandpass signal output terminal.

11. The active RC filter circuit of claim 10 wherein said means for multiplying the signal appearing at the low-pass output terminal of said filter circuit with a second predetermined reference signal to develop an error signal further comprises:

first transistor circuit means responsive to said first reference signal for developing a signal pulse during each alternate half-cycle of said first reference signal; and second transistor circuit means for selectively multiplying the signal appearing at the low-pass output terminal of said filter circuit with said pulses developed by said first transistor circuit.

12. The active RC filter circuit of claim 10 further comprising means for removing from said signal appearing at the low-pass output terminal of said filter circuit signal frequency components caused by said applied input signal substantially near the signal frequency of said first reference signal.

* * * * *